(12) United States Patent
Drissi et al.

(10) Patent No.: US 10,147,637 B2
(45) Date of Patent: Dec. 4, 2018

(54) METHODS FOR FORMING CONDUCTIVE PATHS AND VIAS

(71) Applicant: IMEC VZW, Leuven (BE)

(72) Inventors: Youssef Drissi, Brussels (BE); Ryan Ryoung han Kim, Berterm (BE); Stephane Lariviere, Heverlee (BE); Praveen Raghavan, Leefdaal (BE); Darko Trivkovic, Leefdaal (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/889,043

(22) Filed: Feb. 5, 2018

(65) Prior Publication Data

US 2018/0261497 A1  Sep. 13, 2018

(30) Foreign Application Priority Data

Feb. 10, 2017  (EP) ..................................... 17155680

(51) Int. Cl.

| H01L 21/00 | (2006.01) |
|---|---|
| H01L 21/768 | (2006.01) |
| H01L 21/033 | (2006.01) |
| H01L 23/522 | (2006.01) |

(52) U.S. Cl.
CPC .... *H01L 21/76802* (2013.01); *H01L 21/0337* (2013.01); *H01L 21/76843* (2013.01); *H01L 23/5226* (2013.01)

(58) Field of Classification Search
CPC ........... H01L 21/76802; H01L 21/0337; H01L 21/76843
See application file for complete search history.

(56) References Cited

U.S. PATENT DOCUMENTS

| 5,091,339 A | * | 2/1992 | Carey | ............... | H01L 21/31144 |
|---|---|---|---|---|---|
| | | | | | 216/18 |
| 6,362,527 B1 | * | 3/2002 | Mehta | ............... | H01L 21/76819 |
| | | | | | 257/758 |
| 6,849,541 B1 | * | 2/2005 | Hu | .................... | H01L 21/76811 |
| | | | | | 257/E21.579 |

* cited by examiner

*Primary Examiner* — Richard A Booth
(74) *Attorney, Agent, or Firm* — Knobbe Martens Olson & Bear LLP (57) ABSTRACT

A method of forming conductive paths and vias is disclosed. In one aspect, patterns of a hard mask layer are transferred into a dielectric layer by etching to form trenches. The trenches define locations for conductive paths of an upper metallization level. At least one trench is interrupted in a longitudinal direction by a block portion of the hard mask layer, the block portion defining the tip-to-tip location of a pair of the conductive paths to be formed. The trenches extend partially through the dielectric layer in regions exposed by the hard mask layer, thereby deepening first and the second holes to extend completely through the dielectric layer. After removing the hard mask layer, the deepened first and second holes and the trenches are filled with a conductive material to form the conductive paths in the trenches and to form the vias in the deepened first and second holes.

20 Claims, 11 Drawing Sheets

METHODS FOR FORMING CONDUCTIVE PATHS AND VIAS

CROSS-REFERENCE TO RELATED APPLICATIONS

This application claims foreign priority to European Patent Application No. 17155680.6, filed Feb. 10, 2017, the contents of which are incorporated by reference herein in its entirety.

BACKGROUND

Technological Field

The disclosed technology relates to methods for forming conductive paths and vias.

Description of the Related Technology

Since the introduction of semiconductor devices, the size of semiconductor devices has been continuously shrinking, resulting in smaller semiconductor chip size and increased device density. The continuous reduction of size of allows for increased device performance while reducing the energy consumption and space requirements.

To electrically interconnect the semiconductor devices an electrical interconnect structure including a number of metallization levels may be formed above the devices. A metallization level includes conductive interconnect lines or paths arranged in a dielectric material layer. The dielectric material layer of a metallization level may isolate the conductive paths of the metallization level from a higher and/or a lower metallization level. Conductive paths of different metallization levels may be interconnected by conductive vias extending through the dielectric layers.

A metallization level may be formed by defining patterns including trenches and holes in a dielectric layer, and filling the trenches and holes with a conductive material. Such a process may be referred to as a damascene process. The process may be repeated to form a stack of metallization levels on top of each other.

It is often needed to form an interrupted or discontinuous conductive line with a pair of vias at the ends or tips of the line portions at either side of the interruption, a so-called tip-to-tip location. The line portions may thereby be connected to lines of a lower metallization level.

Line tips and vias may be formed using lithographic techniques, for instance EUV lithography. Line tips and vias may also be defined using multiple patterning techniques such as self-aligned double patterning (SADP) or quadruple patterning (SAQP) combined with block techniques. A pair of vias may be patterned on opposite sides of the block mask.

In state of the art device fabrication, the small critical dimensions of the patterns makes alignment of the vias with respect to a tip-to-tip location challenging.

SUMMARY OF CERTAIN INVENTIVE ASPECTS

A general objective of the disclosed technology is to provide an improved method for forming conductive paths and vias at a tip-to-tip location of a metallization level. Further and alternative objectives may be understood from the following.

According to a first aspect of the disclosed technology there is provided a method for forming conductive paths and vias of an upper metallization level above a lower metallization level including conductive paths, the method including:
  forming a hard mask layer above a dielectric layer arranged above the lower metallization level,
  forming in the hard mask layer patterns including trenches for defining locations for conductive paths of the upper metallization level, which paths are to be formed above the lower metallization level, wherein at least one of the trenches is a discontinuous trench interrupted in a longitudinal direction by a block portion of the hard mask layer, the block portion defining the tip-to-tip location of a pair of the conductive paths of the upper metallization level to be formed,
  forming a second mask layer above the hard mask layer,
  forming an opening in the second mask layer, the opening exposing the block portion and a first trench portion and a second trench portion on opposite sides of the block portion, the first and second trench portions defining locations where the vias are to be formed,
  forming, by etching through the opening, a first and a second hole on opposite sides of the block portion, the first hole extending from the first trench portion and partially through the dielectric layer and the second hole extending from the second trench portion and partially through the dielectric layer,
  removing the second mask layer,
  transferring the patterns of the hard mask layer into the dielectric layer by etching to form trenches extending partially through the dielectric layer in regions exposed by the hard mask layer thereby deepening the first and the second holes to extend completely through the dielectric layer,
  removing the hard mask layer, and
  filling the deepened first and second holes and the trenches with a conductive material to form the conductive paths in the trenches and to form the vias in the deepened first and second holes.

According to a second aspect of the disclosed technology there is provided a method for forming conductive paths and vias of an upper metallization level above a lower metallization level including conductive paths, the method including:
  forming a hard mask layer above a dielectric layer arranged above the lower metallization level,
  forming in the hard mask layer patterns including trenches for defining locations for conductive paths of the upper metallization level to be formed above the lower metallization level,
  forming a second mask layer above the hard mask layer,
  forming an opening in the second mask layer, the opening exposing a portion of a trench of the patterns in the hard mask layer,
  forming a block mask in the opening, the block mask interrupting the exposed portion of the trench in a longitudinal direction thereof, thereby dividing the exposed portion of the trench in a first trench portion and a second trench portion on opposite sides of the block mask, the block mask defining the tip-to-tip location of a pair of the conductive paths of the upper metallization level to be formed, and the first and second trench portions defining locations where the vias are to be formed,
  forming, by etching through the opening, a first and a second hole on opposite sides of the block mask, the first hole extending from the first trench portion, partially through the dielectric layer, and the second hole extending from the second trench portion, partially through the dielectric layer, removing the second mask layer, transferring the patterns of the hard mask layer into the dielectric layer by etching to form trenches extending partially through the dielectric layer in regions exposed by the hard mask layer, thereby deepening the first and the second holes to extend completely through the dielectric layer, removing the hard mask layer and the block mask, and filling the deepened first and second holes and the trenches with a conductive material to form the conductive paths in the trenches and to form the vias in the deepened first and second holes.

The first and the second aspects of the disclosed technology provide alternative methods enabling forming of conductive paths and vias at a tip-to-tip location in an efficient manner. The methods obviate the need to use dual exposure schemes for defining the via locations. Instead, aspects of the disclosed technology allow the via locations to be defined by forming of a single opening above the block portion (according to the first aspect) or the block mask (according to the second aspect).

The formation of the first and the second holes extending partially through the dielectric layer results in a localized thickness reduction of the dielectric layer. By the subsequent transfer of the pattern of the hard mask layer into the dielectric layer, trenches for the conductive paths extending partially through the dielectric layer, and holes for vias extending completely through the dielectric layers, may be formed simultaneously.

The conductive paths and the vias may moreover be formed simultaneously, by filling the trenches and holes with the conductive material. This also contributes to the efficiency of the method according to the disclosed technology.

The block portion or block mask provides the multiple function of defining the location of the interruption of the discontinuous trench in the hard mask layer, acting as an etch mask during the etching of the holes for accommodating the vias at the tip-to-tip location and acting as an etch mask during the transfer of the patterns of the hard mask layer into the dielectric layer.

According to aspects of the disclosed technology, the holes and accordingly the vias may be formed in a self-aligned manner with respect to the block portion or block mask. Alignment of the vias with respect to the tip-to-tip location is thereby facilitated. The self-alignment with respect to the block portion or block mask further enables a footprint of the vias to be increased, wherein an electrical resistance may be reduced.

By a first feature such as a layer, a level or other structure, being formed "above" a second feature such as a layer, a level or other structure, is hereby meant that the first feature is formed above the second feature (as seen) in a normal direction to the main surface or in-plane extension of the feature, e.g., layer or level, or in the normal direction to a substrate on which the lower metallization level may be arranged.

By "metallization level" is hereby meant a structure including conductive paths arranged in a dielectric material layer. The lower metallization level may be a first or lower-most metallization level. The upper metallization level may be a second or second to lower-most metallization level. More generally the lower and upper metallization levels may be any pair of consecutive metallization levels of a stack of metallization levels.

By a "trench" in a layer (e.g., the hard mask layer or in the dielectric layer) is hereby meant a recess in the layer, which at least along a portion thereof extends in a straight line and presents a uniform width.

By "tip-to-tip location" of a pair of conductive paths is hereby meant the region where a conductive path or line is interrupted to be divided into a first path portion or line portion and a second path portion or line portion. The ends of the portions, on opposite sides of the interruption, accordingly form tips (of the paths/lines) at the tip-to-tip location.

The term "hard mask layer" as used herein may be understood as any layer or layer stack having the ability to withstand, and accordingly remain following, the processes used for forming the opening in the second mask layer, the etching of the first and second holes and the transfer of the pattern of the hard mask layer into the dielectric layer. The hard mask layer may for instance be a non-resist based mask layer. This applies correspondingly to the block mask used in the second method aspect of the disclosed technology.

The "hard mask layer" may also be referred to as merely a "first mask layer", i.e., a mask layer which is separate or different from the second mask layer used in aspects of the method.

The hard mask layer may be formed on the dielectric layer. The hard mask layer may be formed directly on the dielectric layer or with one or more intermediate layers between the dielectric layer and the hard mask layer.

The patterns in the hard mask layer include the trenches for defining the locations for conductive paths of the upper metallization level and the block portion defining an interruption of between two (aligned) trench portions. The block portion accordingly defines the tip-to-tip location between a pair of conductive paths. The patterns in the hard mask layer may include at least one, or more, such block portions. Thereby one or more tip-to-tip locations may be defined, allowing forming of one or more pairs of vias at a respective tip-to-tip location.

The trenches in the hard mask layer may extend completely through the hard mask layer. The trenches may accordingly expose an upper surface of the dielectric layer or of an intermediate layer arranged between the dielectric layer and the hard mask layer, if such is present.

The hard mask layer may be formed as a conformal layer, covering the dielectric layer. Patterns may be defined in a patterning layer formed on the hard mask layer and subsequently be transferred into the hard mask layer by etching. The patterns in the patterning layer may be defined using single or multiple patterning processes.

The second mask layer may be any layer or layer stack having the ability to withstand, and accordingly remain following, the etching of the first and second holes.

The opening in the second mask layer may be formed to expose the block portion and a respective bottom surface of the first and the second trench portions.

The second mask layer may be formed by depositing one or more mask layers on the hard mask layer and filling the trenches thereof. The second mask layer may be formed as a planarizing layer.

The opening may be defined in a patterning layer formed on the second mask layer and transferred into the second mask layer by etching until the block portion and a bottom surface of the first and the second trench portions are exposed. The opening may expose (portions of) the upper surface of the dielectric layer or (portions of) an intermediate layer arranged between the dielectric layer and the hard mask layer, if such is present.

During the etching of the first and second holes extending partially through the dielectric layer, the second mask layer acts as an etch mask, counteracting or preventing etching of regions of the dielectric layer covered by the second mask layer while allowing etching of regions of the dielectric layer (or the intermediate layer) exposed in the opening.

Subsequent to etching of the first and the second hole, the second mask layer may be removed wherein the hard mask layer may be exposed.

The transfer of the patterns of the hard mask layer into the dielectric layer, may include reducing a thickness of the regions of the dielectric layer exposed by the (trenches in) hard mask layer by etching, thereby forming trenches in the dielectric layer and simultaneously deepening the first and the second holes in the dielectric layer. The etching may be performed until the first and the second holes extend completely through the dielectric layer.

During the pattern transfer the hard mask layer, including the block portion (according to the first method aspect) or together with the block mask (according to the second method aspect) may act as an etch mask with respect to the dielectric layer.

Subsequent to the pattern transfer, the hard mask layer (and the block mask as the case may be) may be removed, wherein the (remaining portions of) the dielectric layer may be exposed.

The aforementioned dielectric layer above which the hard mask layer is formed in accordance with the first or second method aspects may be the dielectric layer of the upper metallization level.

The dielectric layer may be formed on the lower metallization level. The dielectric layer may be formed on an upper surface of the lower metallization level. The dielectric layer may be formed directly on the lower metallization level or with one or more intermediate layers between the dielectric layer and the lower metallization level. The dielectric layer may be formed to cover the below layer.

A base layer may be arranged between the lower metallization level and the dielectric layer and wherein the deepened first and second holes expose the base layer. Aspects of the disclosed method can further include etching through the base layer prior to the act of filling with a conductive material. An intermediate base layer may for instance include a buffer layer preventing diffusion between the upper and the lower metallization level.

The tip-to-tip location may be defined such that the first and second holes become aligned with a first and a second conductive path, respectively, of the lower metallization level. Thereby, inter-level connections between two different pairs of conductive paths may be formed.

The act of forming patterns in the hard mask layer may include:
forming a set of mandrels above the (un-patterned) hard mask layer,
forming a spacer layer on side walls of the mandrels, to form a set of spacers,
removing the mandrels, and
etching the hard mask layer using the set of spacers as an etch mask.

This is advantageous in that it allows for sub-lithographic patterning of the hard mask layer.

The dielectric layer may include a stack of layers including at least a first dielectric layer and a second dielectric layer, which is advantageous in that the properties of the dielectric layer may be tailored to suit specific needs and desires. The dielectric layer may include a plurality of low k dielectric materials. The dielectric layer may include a low k dielectric material layer, an oxide capping layer, and a low k interface layer.

The hard mask layer may include TiN, titanium nitride.

The block mask (used in the second method aspect) may be formed by a same material as the hard mask layer.

The second mask layer may include a stack of layers including a spin-on-carbon layer (SOC layer), and a spin-on-glass layer (SOG layer). Such layers may be deposited as self-planarizing layers in spin deposition processes.

Methods of the disclosed technology may further include depositing a barrier layer in the trenches of the dielectric layer and in the first and second holes prior to the act of filling with a conductive material, which is advantageous in that atom and ion migration may be counteracted.

According to embodiments of the disclosed technology, the method may further include depositing a liner layer on the barrier layer prior to the act of filling with a conductive material.

Methods of the disclosed technology may further include depositing a conductor seed layer on the liner layer prior to the act of depositing a conductor, which allows for a simplified deposition of the conductor. The conductor seed layer may act as cathode while depositing a metal conductor using electroplating. The conductor seed layer may be a Cu comprising layer.

The first and the second holes and the trenches may be at least partially filled with a conductive material. The conductive material may be a single metal or a mixture or alloy of a metal and another material. A complete filling of the first and the second holes and the trenches is preferable for ensuring that the entire cross-sectional area, allowed by the trenches in the dielectric layer, is filled by the conductive material to obtain a low-resistance interconnect structure.

Conductive material may also be provided to cover surfaces of the dielectric layer outside of the trenches. Such excess material may subsequently be removed by planarization and/or etch back.

The act of filling with a conductive material may accordingly include forming the conductive material also above the dielectric layer and removing the conductive material in locations outside of the trenches of the dielectric layer and the deepened first and second holes. The removing of excess conductive material planarization and thickness reduction may divide the deposited conductor into separate paths extending within the trenches of the dielectric layer.

It is to be understood that the terminology used herein is for purpose of describing particular embodiments only, and is not intended to be limiting. It must be noted that, as used herein, the articles "a," "an," and "the" are intended to mean that there are one or more of the elements unless the context clearly dictates otherwise. Thus, for example, reference to "a unit" or "the unit" may include several devices, and the like. Furthermore, the words "comprising," "including," "containing" and similar wordings does not exclude other elements or steps.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

FIGS. 1A through 1J illustrate a method for forming conductive paths and vias of an upper metallization level above a lower metallization level.

As illustrated in the figures, the sizes of layers and regions are exaggerated for illustrative purposes and, thus, are provided to illustrate the general structures of embodiments of the disclosed technology.

DETAILED DESCRIPTION OF CERTAIN ILLUSTRATIVE EMBODIMENTS

A method for forming conductive paths and vias of an upper metallization level above a lower metallization level will now be described with reference to FIGS. 1A through 1J.

Figure 1A:
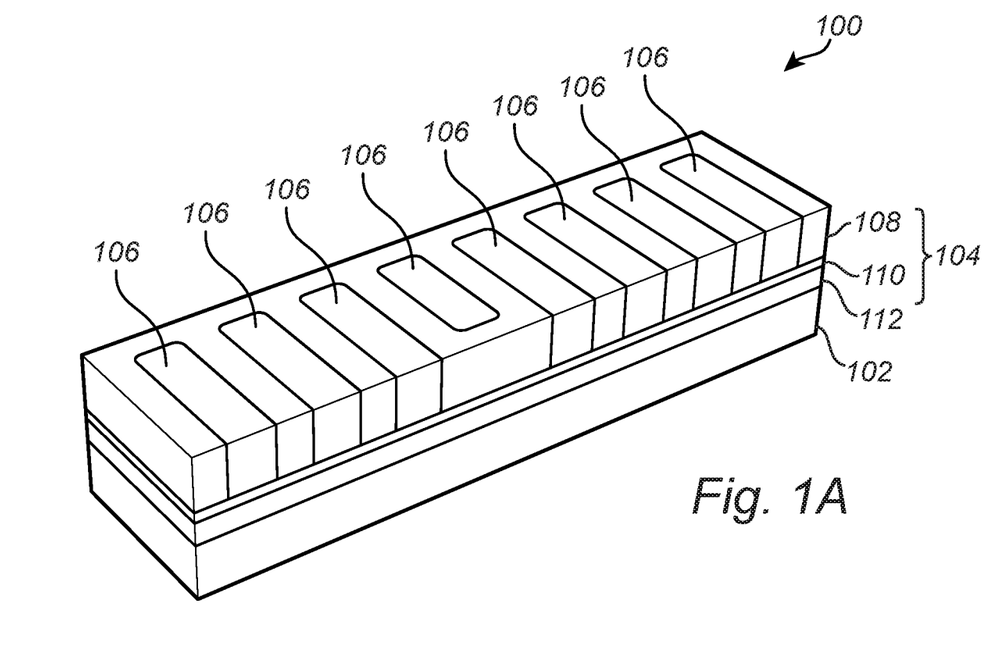

FIG. 1A shows, in perspective, a section of a semiconductor structure or device 100. The structure 100 may extend laterally/horizontally beyond the illustrated section. The illustrated front face/plane of section extending through the structure 100 are common to all the figures.

The structure 100 depicted in FIG. 1A includes a substrate 102 on which a metallization level 104 is arranged. The metallization level 104 is a lower metallization level 104 relative to an upper metallization lever to be formed and will be referred to as such.

The lower metallization level 104 is formed on a main surface of the substrate 102. The lower metallization level 104 includes conductive paths 106 arranged in a dielectric layer 108. The conductive paths 106 are in the depicted embodiments formed as elongated conductive paths or lines 106 arranged in the dielectric layer 108. As depicted in FIG. 1A, an upper surface of the conductive paths 106 is flush or co-planar with an upper surface of the dielectric layer 108. The lower metallization level 104 may, as shown, include a base layer 110 for separating the lower metallization level 104 from any structures, layers or similar present below the lower metallization level 104. The lower metallization level may be formed using any suitable technique, such as a damascene process.

In the depicted embodiment, an active device layer 112 is present below the base layer 110. For clarity of the illustrations, the active device level 112 is shown in a merely schematic manner and not drawn to scale in FIG. 1A.

The active device layer 112 may form part of a front-end-of-line (FEOL) portion of the structure 100. Correspondingly, the lower and upper metallization levels may form part of a back-end-of-line (BEOL) portion of the structure 100.

Figure 1B:
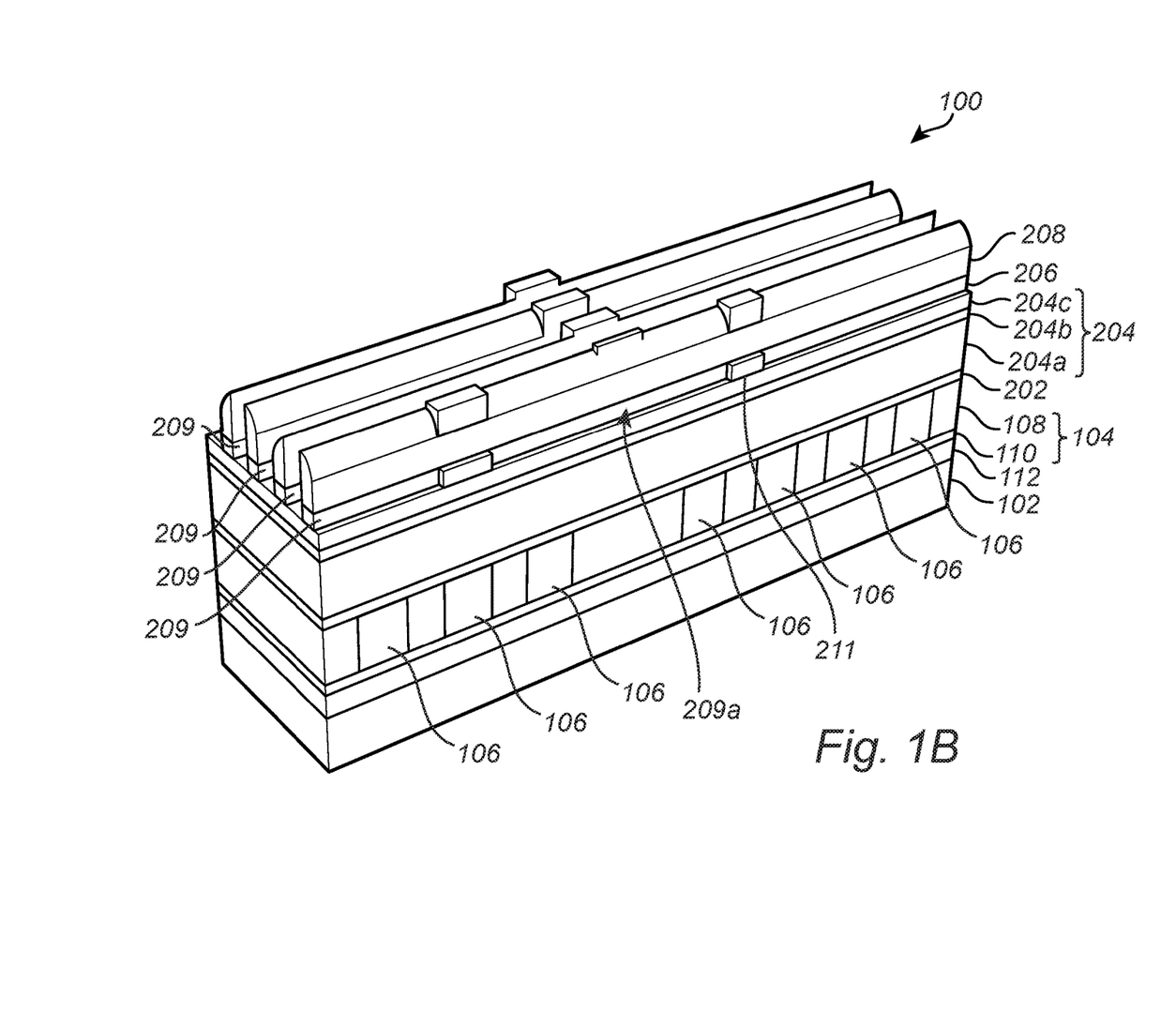

In FIG. 1B, a base layer 202 is formed on the dielectric layer 108 and the conductive paths 106 of the lower metallization level 104. The base layer 108 may be a conformal layer. The base layer 108 may for instance be a silicon carbon nitride layer, SiCN layer.

A dielectric layer 204 is formed above the base layer 202. The dielectric layer 204 may be a single layer or a stack of layers 204a, 204b, 204c covering the base layer 202. The dielectric layer 204 may for instance include a first layer 204a forming a low-K dielectric material layer. The layer 204a may for instance be a silicon dioxide layer. The dielectric layer 204 may for instance include a second layer 204b forming a low-K interface layer 204b. The dielectric layer 204 may for instance include a third layer 204c forming an oxide capping layer 204c. The layers 204b, 204c may, as will be described below, form sacrificial layers. The layer(s) may be deposited by Atomic Layer Deposition (ALD) or Chemical Vapor Deposition (CVD).

A hard mask layer 206 is formed on the dielectric layer 204. The hard mask layer 206 may be formed by conformally depositing a suitable hard mask material above the dielectric layer 204, for instance TiN. The hard mask layer may be formed by ALD, CVD, or physical vapor deposition (PVD), to give a few examples.

As may be seen in FIG. 1B, patterns including trenches 209 have been formed in the hard mask layer 206. The trenches 209 define locations for conductive paths of the upper metallization level which is to be formed. The trenches 209 include a discontinuous trench 209a interrupted in a longitudinal direction by a block portion 211, forming part of the hard mask layer 206. The trench 209a is thus divided into a first trench portion 209b and a second trench portion 209c on opposite sides of the block portion 211. The block portion 211 defines the tip-to-tip location.

The trenches 209, 209a in the hard mask layer 206 may be patterned using various patterning techniques including single or multi-exposure lithographic techniques or multiple-patterning techniques such as self-aligned double patterning (SADP), self-aligned triple patterning (SATP), or self-aligned quadruple patterning (SAQP).

The patterns for the hard mask layer 206 may for instance be defined by forming and patterning a resist-based etch mask layer 208 formed above the hard mask layer 206, by, for example, spin coating, and consecutively transfer the pattern of the resist to the hard mask layer. The resist layer may be patterned using single or multi-exposure lithographic techniques. Advantageously, the patterns may be defined using a single-exposure Extreme UV (EUV) lithography process. The patterns may be transferred into the hard mask layer 206 by dry or wet etching. In case of a TiN hard mask layer, a HNO3 or (buffered) HF for wet etching, or CHF3, CF4 or Cl2 based plasmas may, for example, be used for dry etching of the hard mask layer 206. Preferably, an anisotropic etch is used for etching the hard mask layer 206.

In an SADP-process, a mandrel layer may be formed above the hard mask layer 206, and a set of elongated and parallel mandrels may be formed in the mandrel layer using lithography and etching. Sidewall spacers may thereafter be deposited on the set of mandrels. The deposition of the side wall spacers may include conformal deposition of a layer including, for example, SiN and/or SiCN. The mandrels may thereafter be removed by etching, while leaving the side wall spacers. The side wall spacers may subsequently be used as an etch mask 208, wherein pattern defined by the etch mask 208 may be transferred, by etching, into the hard mask layer 206.

In an SATP-process, the pitch of the patterns defined may be further reduced, compared to SADP. The SATP process is similar to the SADP process but involves the depositing and etching of a second spacer. The pattern may thus be quadrupled.

In an SAQP-process, two mandrel layers may be used, a top and a bottom mandrel layer. A first set of mandrels may be formed in the top mandrel layer in a fashion described above using lithographic patterning techniques. A first set of spacers may thereafter be formed on sidewalls of the first set of mandrels in a fashion described above. Following this the bottom mandrel layer may be etched using the first set spacers as an etch mask, i.e. the pattern defined by the first set of spacers may be transferred to the bottom mandrel layer, thereby forming a second set of mandrels. A second set of sidewall spacers may thereafter be formed similarly on the second set of mandrels. Finally, the hard mask layer 206 may be etched, using the second set of sidewall spacers as an etch mask 208. The pattern defined by the etch mask 208 may thus be transferred into the hard mask layer 208.

Multiple-patterning techniques may be combined with conventional block forming techniques for forming the block portion 211. For instance, a block mask, which may be resist based, may be formed on the etch mask 208 resulting from the multi-patterning process. The block resist mask may be formed at a location where the block portion 211, and accordingly the interrupted trench 209*a*, is to be formed. Thereafter the combined patterns of the etch mask 208 and the block resist mask may be transferred to the hard mask layer 206 wherein etching of the portions of the hard mask layer 206 covered by the etch mask 208 is counteracted. The block-shaped protrusions on top of the elongated structures of the etch mask 208 are remaining artifacts of a block forming process.

Figure 1C:
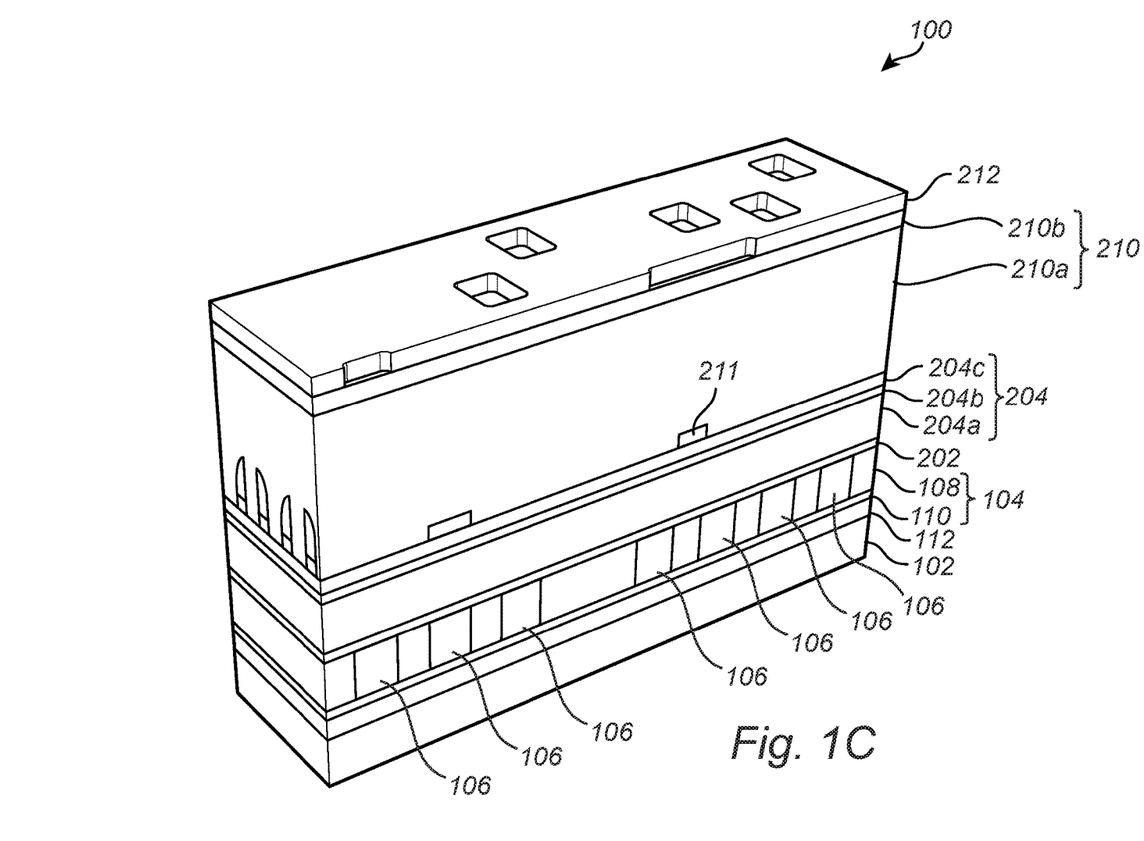

In FIG. 1C a second mask layer 210 is formed above the hard mask layer 206. The second mask layer 210 may be formed to planarize the structure 100. The second mask layer 210 may be a single layer or a stack of layers. The second mask layer 210 may include a spin-on-carbon (SOC) layer 210*a*. The second mask layer 210 may include a spin-on-glass (SOG) layer 210*b*. The SOC layer 210*a* may be formed on and covering the etch mask 208. The SOG layer 210*b* may be formed on the SOC layer 210*a*.

As further shown in FIG. 1C, an etch mask 212 including an opening is formed above the second mask layer 210. The etch mask 212 may for instance be formed by spin coating of a resist followed by an exposure and a subsequent development to form the pattern of the etch mask 212.

Figure 1D:
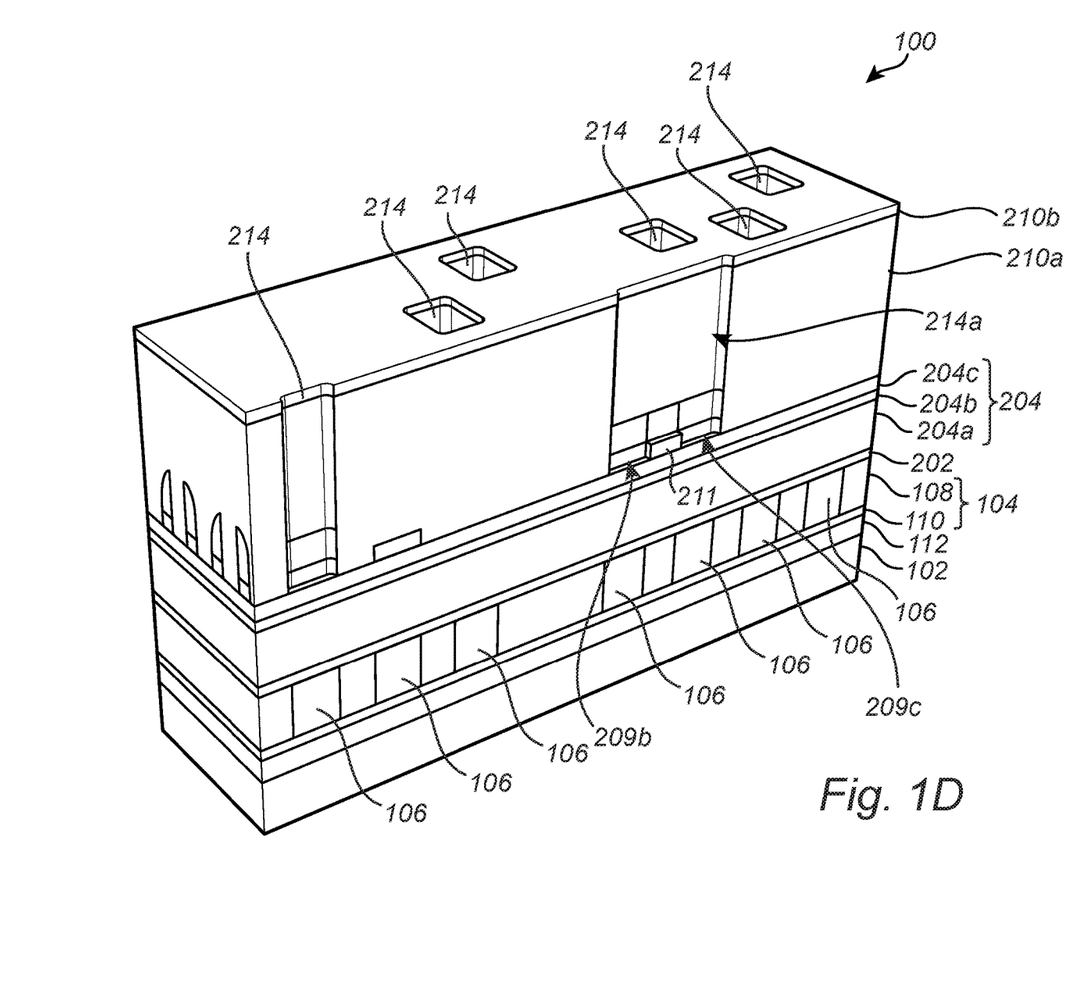

In FIG. 1D the second mask layer 210 has been patterned by etching through the opening in the second mask layer 210. By the etching, openings 214 extending vertically through the second mask layer 210 are formed. The opening 214*a* formed in the second mask layer 210 exposes the block portion 211, the first trench portion 209*b*, and the second trench portion 209*c*.

An anisotropic etch may be used to form a steep sidewall when etching in the second mask layer 210. As an example, RIE may be used. When forming the openings 214 through the multi-layer stack of the second mask layer 210, the etching chemistry and/or process may be changed in accordance with the type of material which is to be etched.

Following forming of the openings 214, the etch mask 212 may be stripped.

Figure 1E:
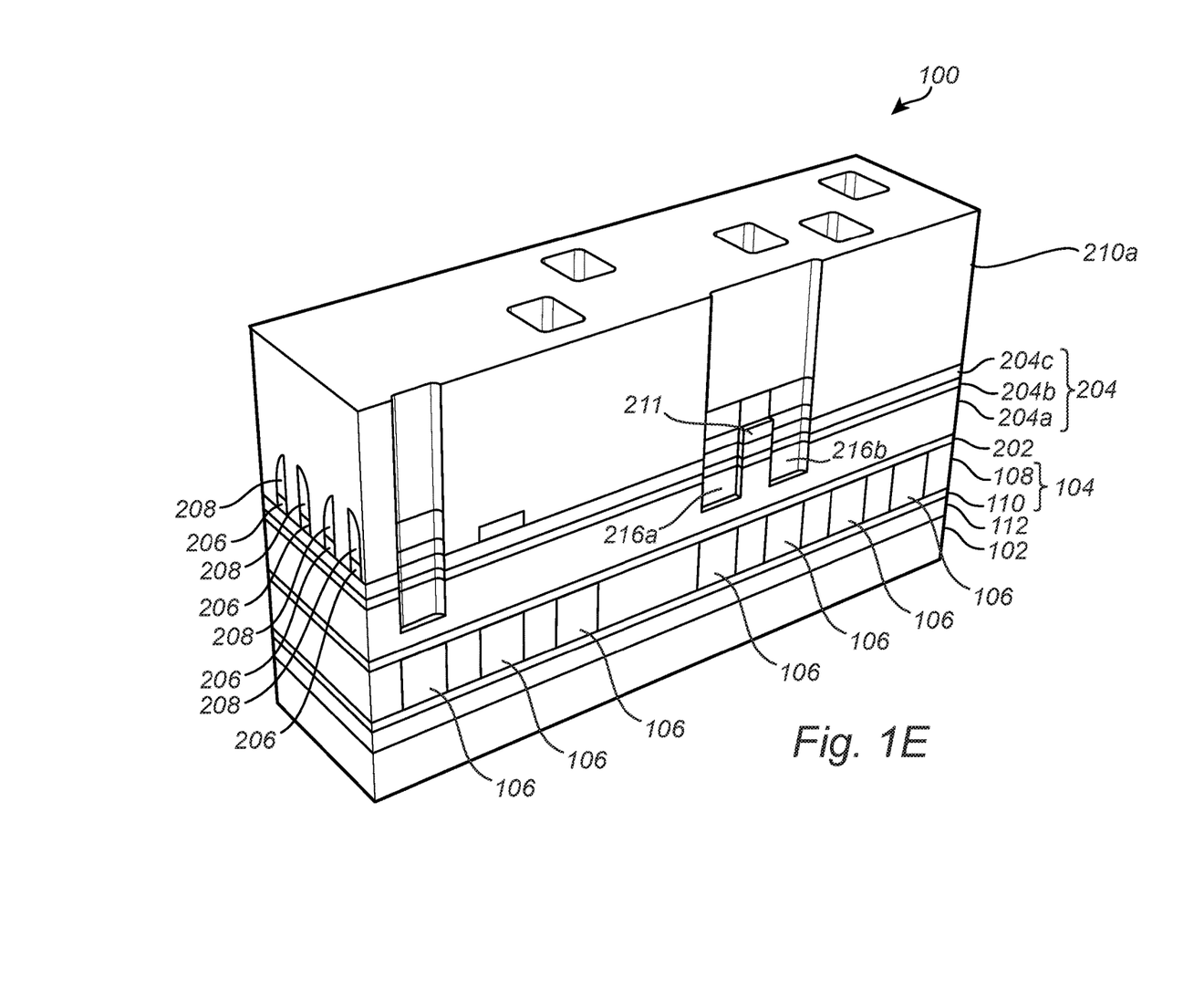

In FIG. 1E, a first hole 216*a* and a second hole 216*b* has been formed by further etching through the opening 214*a*. The first hole 216*a* extends from the first trench portion 210*b* and partially through the dielectric layer 204. The second hole 216*b* extends from the second trench portion 210*c* and partially through the dielectric layer 204. During the etching of the dielectric layer 204, the block portion 211 of the hard mask layer 206 acts as an etch mask, counteracting etching of a below portion of the dielectric layer 204. In regions covered by the second mask layer 210, etching will correspondingly be prevented by the second mask layer 210. Any suitable etch technique may be used, such as RIE. An anisotropic etch is preferably used.

Figure 1F:
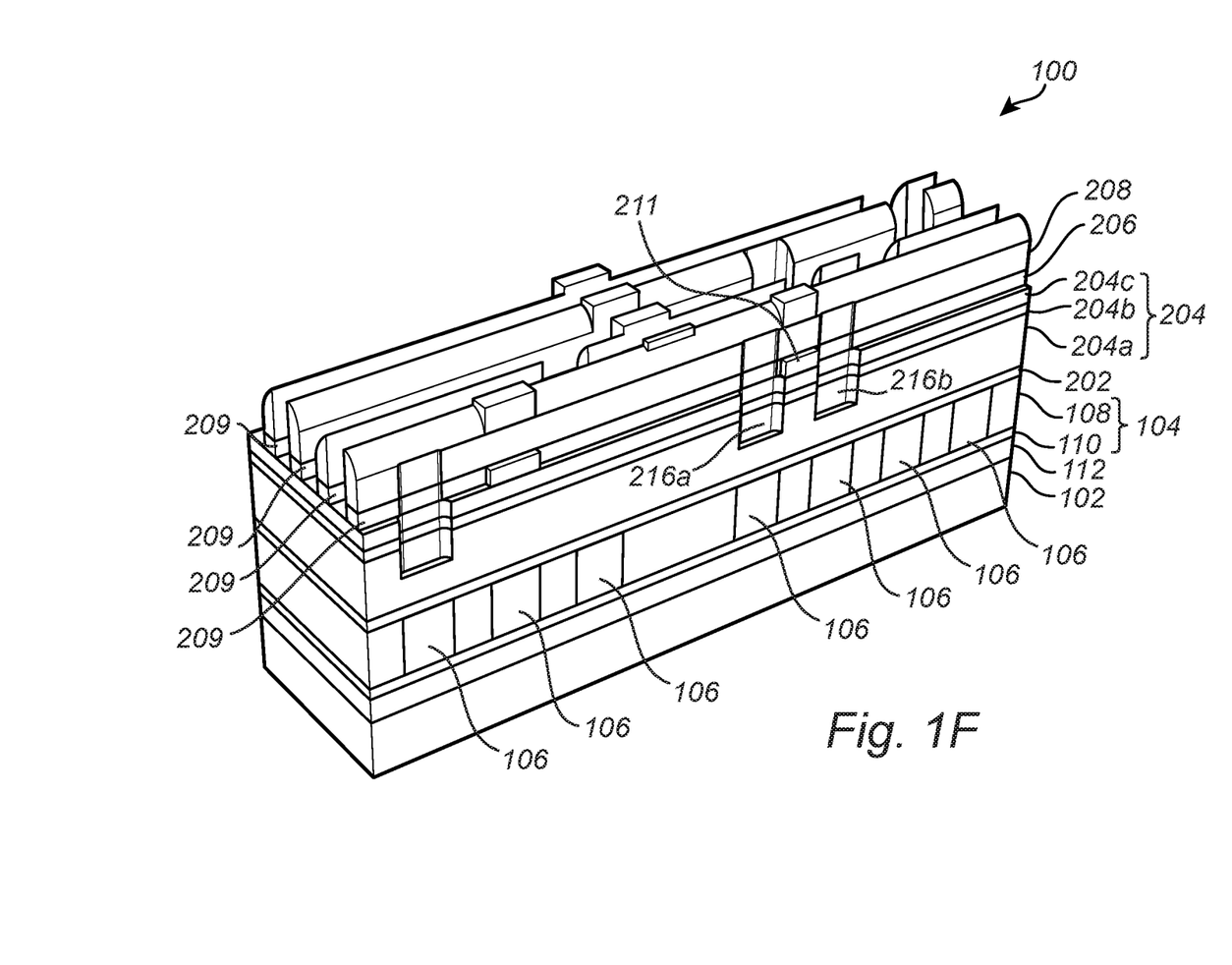

In FIG. 1F, the second mask layer 210 has been removed. The second mask layer 210 may be removed using any suitable technique such as a wet etching or removal process or by a dry etching process. The removal of the second mask 210 results in that the etch mask 208 and the trenches 209 are exposed. More specifically, the portions of the dielectric layer 204 forming the bottom surfaces of the trenches 209 are exposed.

Figure 1G:
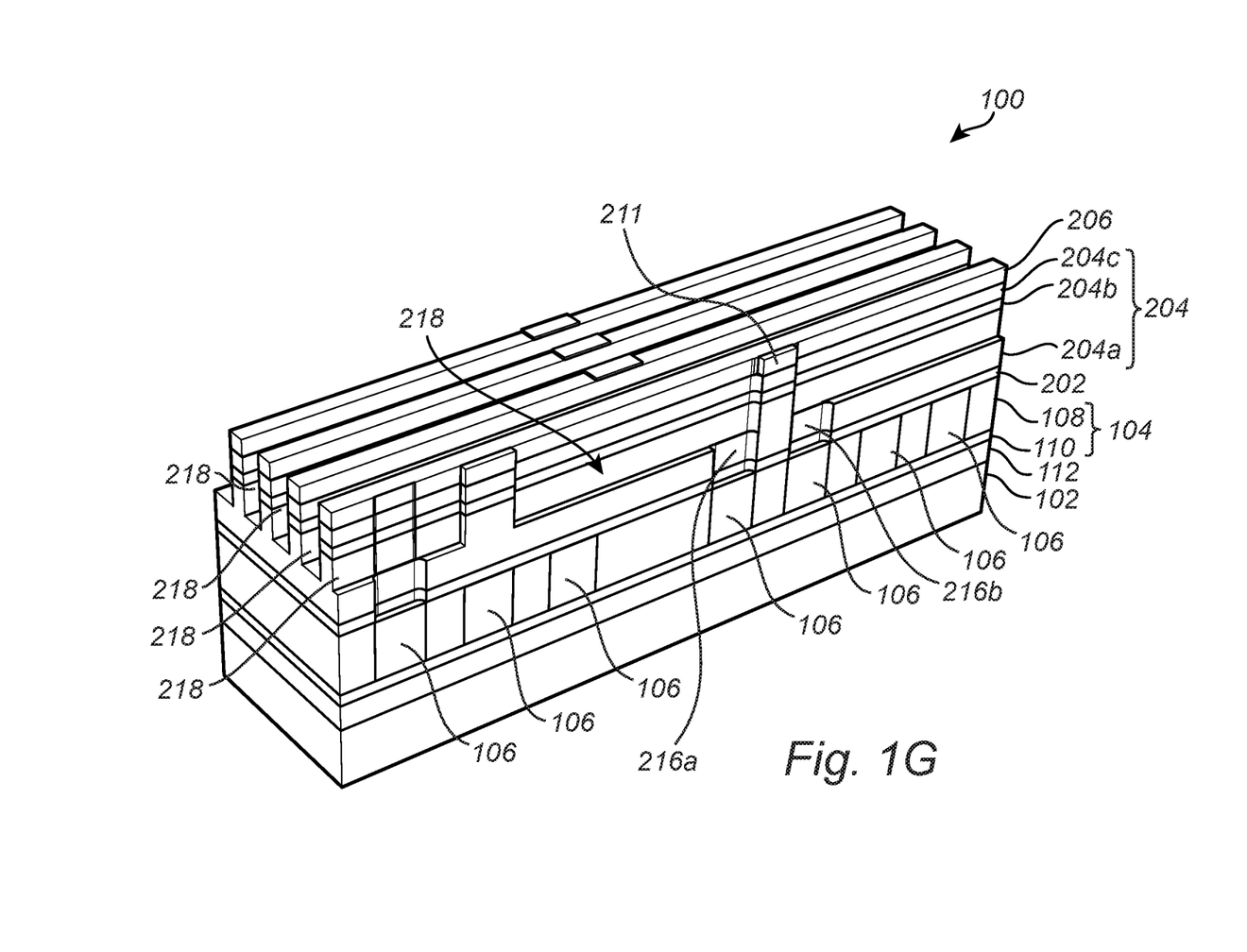

In FIG. 1G, also the etch mask 208 has been removed. The etch mask 208 may for instance be removed by a wet etching process or a by a dry etching process.

Further in FIG. 1G, the patterns of the hard mask layer 206 have been transferred into the dielectric layer 204. The dielectric layer 204 has been etched while the hard mask layer 206 has prevented etching in regions covered by the hard mask layer 206. The etching of the dielectric layer 204 has been performed such that the thickness of the dielectric layer 204 is reduced in regions exposed by the hard mask layer 206. The patterns including the trenches 209 in the hard mask layer 206 have accordingly been transferred to trenches 218 in the dielectric layer 204. During the etching, the first and the second holes 216*a*, 216*b* are deepened and are now extending completely through the dielectric layer 204.

Due to the block portion 211, a discontinuous trench 218*c* is formed which is divided by a pillar-shaped portion of the dielectric layer 204, formed between the first and the second holes 216*a*, 216*b*.

If also a base layer 102 is present in the structure 100, also the base layer 102 may be etched through as shown in FIG. 1G. A same etching technique as used during the forming of the holes 216*a*, 216*b* may be used.

Figure 1H:
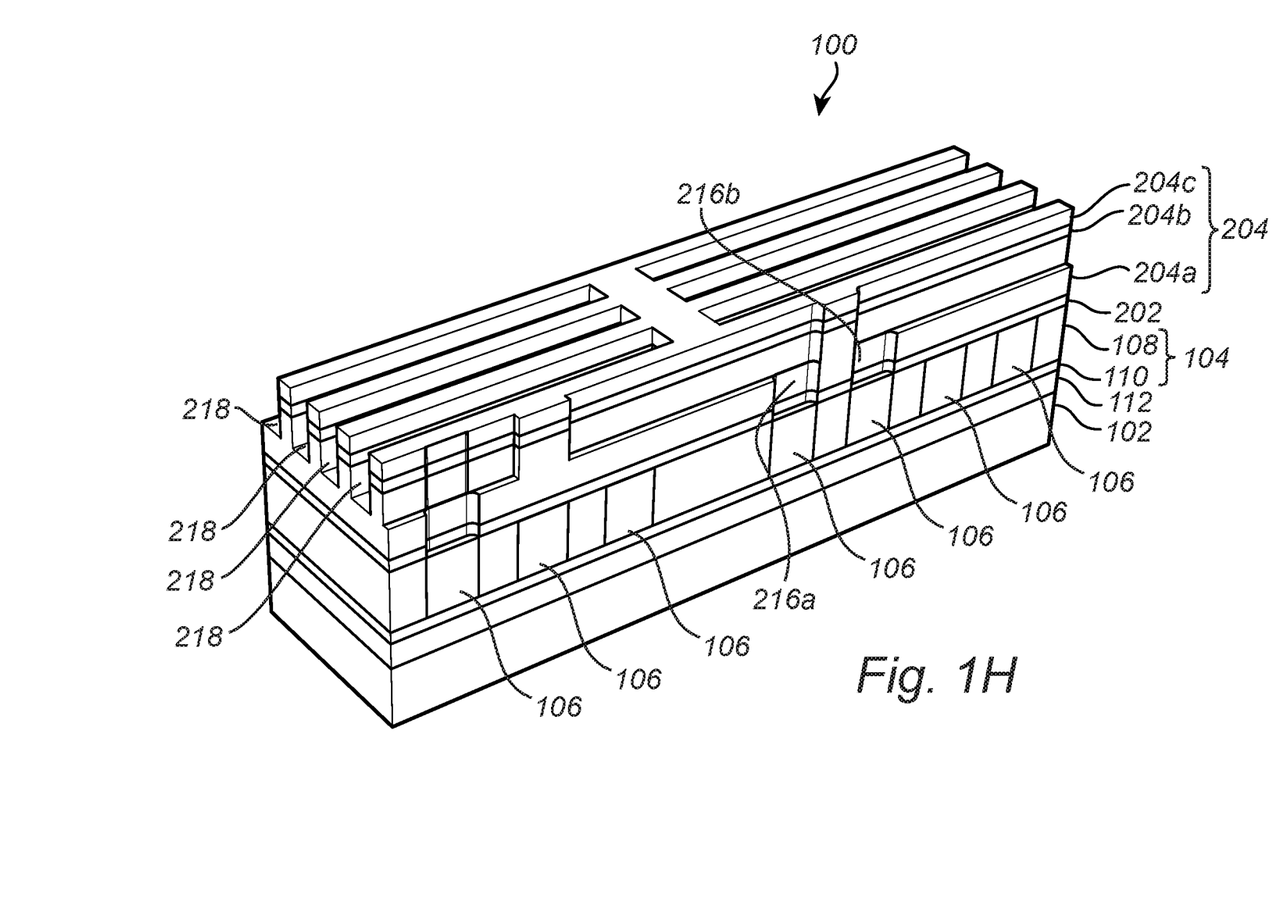

In FIG. 1H, the hard mask layer 206 has been removed. The hard mask layer 206 may for instance be removed by a wet etching process or by a dry etching process.

In FIG. 1I, the trenches 218, 218*c* and the deepened holes 216*a*, 216*b* have been filled with a conductive material 220, such as Cu, Al or W. The conductive material 220 filling the trenches 218, 218*c* forms conductive paths 222 in the trenches 218 of the dielectric layer 204, although not being separated from each other yet. The conductive material may be formed in a plating process. The conductive material 220 filling the holes 216*a*, 216*b* forming vias 223*a*, 223*b*. The first and second holes 216*a*, 216*b* are aligned with a pair of the conductive paths 106 of the lower metallization level 104. The vias 223*a*, 223*b* accordingly provide an electrical contact between the conductive paths 106 and the conductive paths 222.

As shown in FIG. 1I, prior to the filling with conductive material 220 a barrier layer 224 may be formed in the trenches 218 and the holes 216*a*, 216*b*. Further, a liner layer 226 may be formed on the barrier layer 224. Furthermore, a conductor seed layer 228 may be formed on the liner layer 224 for facilitating forming of the conductive material 220. The seed layer 226 may be formed by a same material as the conductive material 220.

Figure 1J:
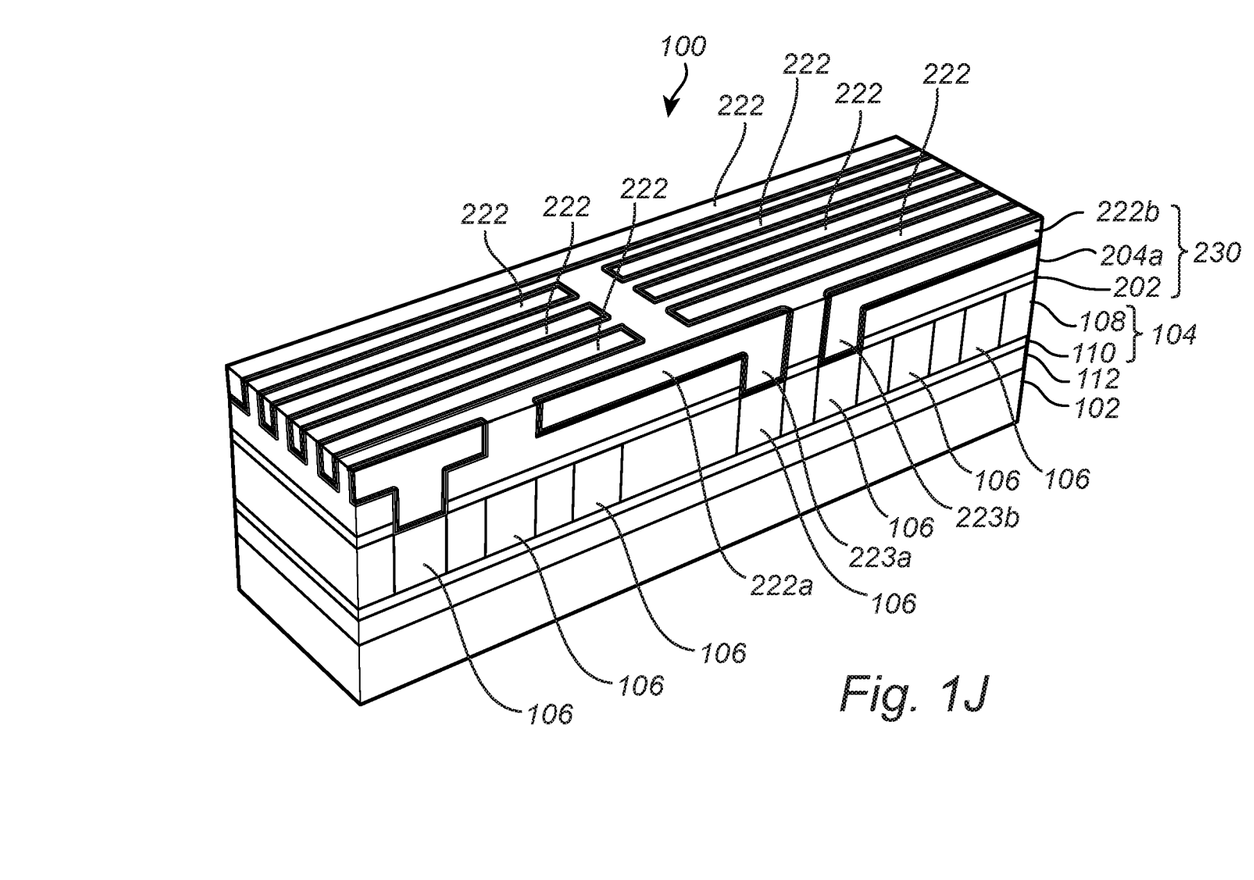

In FIG. 1J, excess portions of the conductive material 220 (as well as of the barrier layer 224, the liner layer 226 and the seed layer 228) have been removed from portions of the dielectric layer 204 outside of the trenches 218 and the first and second holes 216*a*, 216*b*. The portions may be removed by reducing a thickness of the conductive material 220 (and if applicable the barrier layer 224, the liner layer 226 and the seed layer 228) until the upper surface of the dielectric layer 204 is exposed. As indicated in FIG. 1J, the thickness reduction may include removal of the layers 204*c* and 204*b* such that only the layer 204*a* of the dielectric layer 204 remains. The thickness reduction may be performed by etch back and/or chemical mechanical polishing, CMP.

Separated conductive paths 222*a* and 222*b* have thus been formed in the discontinuous trench 218*c*, which are connected by the respective via 223*a*, 223*b* to conductive paths 106 of the lower metallization level 104. The conductive paths 222, 222*a*, 222*b*, the vias 223*a*, 223*b*, the dielectric layer 204 (or remaining portions thereof such as 204a), and optionally the base layer 202 form part of an upper metallization level 230.

An alternative method for forming conductive paths 222, 222a, 222b and vias 223a, 223b of an upper metallization level 230 above a lower metallization level 106 will now be described with reference to FIG. 2.

Figure 2:
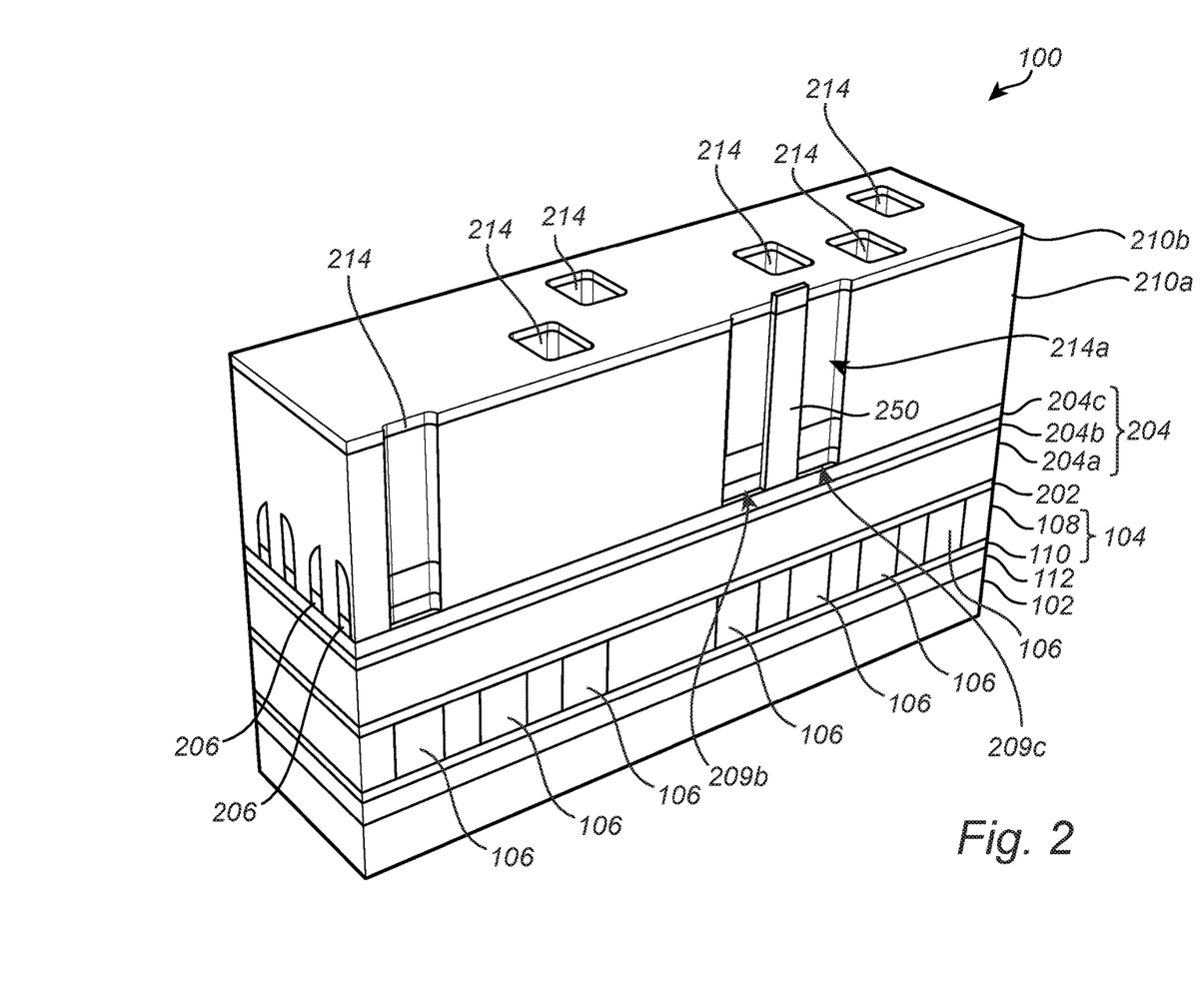
FIG. 2 illustrates an alternative method for forming conductive paths and vias of an upper metallization level above a lower metallization level.

FIG. 2 shows, in perspective, a section of a semiconductor structure 100. The structure 100 in FIG. 2 corresponds to the state of the structure 100 shown in FIG. 1D. Accordingly trenches corresponding to the trenches 209 have been formed in the hard mask layer 206. Similarly, the trenches are filled and covered by the second mask layer 210. Openings 214 in the second mask layer 210 have been formed as described in connection with FIG. 1D. The opening 214a exposes a portion of a trench in the hard mask layer However, in the structure 100 of FIG. 2, the hard mask layer 206 does not include any block portion or block portions. Instead, a separate block mask 250 is employed, as will be described in the following.

In the opening 214a a block mask 250 has been formed in a central location of the opening 214a. A self-aligned technique may be used to form the block mask 250 in a centered location of the opening 214a. For instance, sidewall spacers may be formed on the sidewalls in the opening 214a. A spacer material may be deposited as a conformal layer and then anisotropically etched such that separated sidewall spacers remain on the sidewalls of the opening 214. The block mask material may then be deposited in the opening 214a, between the sidewall spacers. The sidewalls spacers may then be selectively removed in the opening by etching, leaving the block mask 250 at a centered location in the opening 214a. Alternatively, the block mask 250 may be defined using lithographic techniques, for instance by patterning a resist above a layer of block mask material, the pattern aligned with the opening 214a, and transferring by etching the pattern into the block mask material to form the block mask 250. The block mask 250 may be formed of a same material as the hard mask layer. The block mask 250 formed in the opening 214a interrupts the exposed portion of the trench 209 in a longitudinal direction of the trench 209, thereby dividing the exposed portion of the trench 209 in a first trench portion 209b and a second trench portion 209c on opposite sides of the block mask 250. The block mask 250 defines accordingly the tip-to-tip location. The block mask 250 is thus filling the same purpose as the block portion 211 of the firstly described method, described in conjunction with FIGS. 1A through 1J.

Following the formation of the block mask 250 in the opening 214a, the method may continue essentially as described above, i.e., in accordance with the firstly described method, described in conjunction with FIGS. 1A through 1J. The block mask 250 may be removed in a same process step as the hard mask layer 206.

In the above the inventive concept has mainly been described with reference to a limited number of examples. However, as is readily appreciated by a person skilled in the art, other examples than the ones disclosed above are equally possible within the scope of the disclosed technology.

What is claimed is:

1. A method of forming conductive paths and vias of an upper metallization level above a lower metallization level including conductive paths, the method comprising:
    forming a hard mask layer above a dielectric layer arranged above the lower metallization level;
    forming in the hard mask layer patterns including trenches for defining locations for conductive paths of the upper metallization level to be formed above the lower metallization level, wherein at least one of the trenches is a discontinuous trench interrupted in a longitudinal direction by a block portion of the hard mask layer, the block portion defining the tip-to-tip location of a pair of the conductive paths of the upper metallization level to be formed;
    forming a second mask layer above the hard mask layer;
    forming an opening in the second mask layer, the opening exposing the block portion and a first trench portion and a second trench portion on opposite sides of the block portion, the first and second trench portions defining locations where the vias are to be formed;
    forming, by etching through the opening, a first and a second hole on opposite sides of the block portion, the first hole extending from the first trench portion and partially through the dielectric layer, and the second hole extending from the second trench portion and partially through the dielectric layer;
    removing the second mask layer;
    transferring the patterns of the hard mask layer into the dielectric layer by etching to form trenches extending partially through the dielectric layer in regions exposed by the hard mask layer thereby deepening the first and the second holes to extend completely through the dielectric layer;
    removing the hard mask layer; and
    filling the deepened first and second holes and the trenches with a conductive material to form the conductive paths in the trenches and to form the vias in the deepened first and second holes.

2. The method according to claim 1, wherein a base layer is arranged between the lower metallization level and the dielectric layer, wherein the deepened first and second holes expose the base layer, and wherein the method further comprises etching through the base layer prior to filling with a conductive material.

3. The method according to claim 1, wherein the tip-to-tip location is defined such that the first and second holes become aligned with a first and a second conductive path, respectively, of the lower metallization level.

4. The method according to claim 1, wherein forming trenches in the hard mask layer comprises:
    forming a set of mandrels;
    forming a spacer layer on side walls of the mandrels, to form a set of spacers;
    removing the mandrels; and
    etching the hard mask layer using the set of spacers as an etch mask.

5. The method according to claim 1, wherein the dielectric layer comprises a stack of layers including a first dielectric layer and a second dielectric layer.

6. The method according to claim 1, wherein the hard mask layer comprises titanium nitride.

7. The method according to claim 1, wherein the second mask layer comprises a stack of layers including a spin on carbon layer and a spin on glass layer.

8. The method according to claim 1, further comprising:
    forming a barrier layer in the trenches of the dielectric layer and in the first and second holes prior to filling with a conductive material;
    forming a liner layer on the barrier layer prior to filling with a conductive material; and
    forming a conductive seed layer on the liner layer prior to filling with a conductive material.

9. The method according to claim 1, wherein filling with a conductive material further comprises:

forming the conductive material also above the dielectric layer; and
removing the conductive material in locations outside of the trenches of the dielectric layer and the deepened first and second holes.

10. The method according to claim 1, wherein the transfer of the patterns of the hard mask layer into the dielectric layer comprises reducing, by etching, a thickness of the dielectric layer in regions of the dielectric layer exposed by the trenches in the hard mask layer, thereby forming the trenches in the dielectric layer and simultaneously deepening the first and the second holes in the dielectric layer.

11. A method of forming conductive paths and vias of an upper metallization level above a lower metallization level including conductive paths, the method comprising:
forming a hard mask layer above a dielectric layer arranged above the lower metallization level;
forming in the hard mask layer patterns including trenches for defining locations for conductive paths of the upper metallization level to be formed above the lower metallization level;
forming a second mask layer above the hard mask layer;
forming an opening in the second mask layer, the opening exposing a portion of a trench of the patterns in the hard mask layer;
forming a block mask in the opening, the block mask interrupting the exposed portion of the trench in a longitudinal direction thereof, thereby dividing the exposed portion of the trench in a first trench portion and a second trench portion on opposite sides of the block mask, the block mask defining the tip-to-tip location between a pair of the conductive paths of the upper metallization level to be formed and the first and second trench portions defining locations where the vias are to be formed;
forming, by etching through the opening, a first and a second hole on opposite sides of the block mask, the first hole extending from the first trench portion, partially through the dielectric layer, and the second hole extending from the second trench portion, partially through the dielectric layer;
removing the second mask layer;
transferring the patterns of the hard mask layer into the dielectric layer by etching to form trenches extending partially through the dielectric layer in regions exposed by the hard mask layer thereby deepening the first and the second holes to extend completely through the dielectric layer;
removing the hard mask layer and the block mask; and
filling the deepened first and second holes and the trenches with a conductive material to form the conductive paths in the trenches and to form vias in the deepened first and second holes.

12. The method according to claim 11, wherein a base layer is arranged between the lower metallization level and the dielectric layer, wherein the deepened first and second holes expose the base layer, and wherein the method further comprises etching through the base layer prior to filling with a conductive material.

13. The method according to claim 11, wherein the tip-to-tip location is defined such that the first and second holes become aligned with a first and a second conductive path, respectively, of the lower metallization level.

14. The method according to claim 11, wherein forming trenches in the hard mask layer comprises:
forming a set of mandrels;
forming a spacer layer on side walls of the mandrels, to form a set of spacers;
removing the mandrels; and
etching the hard mask layer using the set of spacers as an etch mask.

15. The method according to claim 11, wherein the dielectric layer comprises a stack of layers including a first dielectric layer and a second dielectric layer.

16. The method according to claim 11, further comprising:
forming a barrier layer in the trenches of the dielectric layer and in the first and second holes prior to filling with a conductive material;
forming a liner layer on the barrier layer prior to filling with a conductive material; and
forming a conductive seed layer on the liner layer prior to filling with a conductive material.

17. The method according to claim 11, wherein filling with a conductive material further comprises:
forming the conductive material also above the dielectric layer; and
removing the conductive material in locations outside of the trenches of the dielectric layer and the deepened first and second holes.

18. The method according to claim 11, wherein the transfer of the patterns of the hard mask layer into the dielectric layer includes reducing, by etching, a thickness of the dielectric layer in regions of the dielectric layer exposed by the trenches in the hard mask layer, thereby forming the trenches in the dielectric layer and simultaneously deepening the first and the second holes in the dielectric layer.

19. The method according to claim 11, wherein the transfer of the patterns of the hard mask layer into the dielectric layer includes reducing, by etching, a thickness of the dielectric layer in regions of the dielectric layer exposed by the trenches in the hard mask layer and by the block mask, thereby forming the trenches in the dielectric layer and simultaneously deepening the first and the second holes in the dielectric layer.

20. The method according to claim 11, wherein the block mask is formed by a same material as the hard mask layer.

* * * * *